(12) United States Patent
Taviani et al.

(10) Patent No.: US 10,114,099 B2
(45) Date of Patent: Oct. 30, 2018

(54) HIGH RESOLUTION MAGNETIC RESONANCE IMAGING WITH REDUCED DISTORTION BASED ON REDUCED-FIELD-OF-VIEW AND GENERALIZED PARALLEL IMAGING

(71) Applicant: The Board of Trustees of the Leland Stanford Junior University, Palo Alto, CA (US)

(72) Inventors: Valentina Taviani, Stanford, CA (US); Brian A. Hargreaves, Menlo Park, CA (US); Bruce L Daniel, Stanford, CA (US); Shreyas S Vasanawala, Stanford, CA (US); Suchandrima Banerjee, Menlo Park, CA (US)

(73) Assignees: The Board of Trustees of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 876 days.

(21) Appl. No.: 14/619,788

(22) Filed: Feb. 11, 2015

(65) Prior Publication Data
US 2016/0231409 A1    Aug. 11, 2016

(51) Int. Cl.
*G01R 33/561* (2006.01)
*G01R 33/483* (2006.01)

(52) U.S. Cl.
CPC ...... *G01R 33/5611* (2013.01); *G01R 33/4835* (2013.01); *G01R 33/4836* (2013.01); *G01R 33/5616* (2013.01)

(58) Field of Classification Search
CPC ............ G01R 33/4835; G01R 33/4836; G01R 33/5611; G01R 33/5616

USPC .................................................. 324/300–322
See application file for complete search history.

(56) References Cited

U.S. PATENT DOCUMENTS

| | | | |
|---|---|---|---|
| 2008/0303521 A1* | 12/2008 | Beatty | G01R 33/4824 324/312 |
| 2009/0072827 A1* | 3/2009 | Hargreaves | G01R 33/4822 324/309 |
| 2012/0056620 A1* | 3/2012 | Feinberg | G01R 33/4835 324/309 |
| 2015/0301143 A1* | 10/2015 | Banerjee | G01R 33/4835 324/309 |
| 2016/0139222 A1* | 5/2016 | Frydman | G01R 33/483 324/309 |

(Continued)

OTHER PUBLICATIONS

Saritas, Emine Ulku, et al. "Hadamard slice encoding for reduced-FOV diffusion-weighted imaging." Magnetic resonance in Medicine 72.5 (2014): 1277-1290.*

(Continued)

*Primary Examiner* — Rishi Patel
(74) *Attorney, Agent, or Firm* — Lumen Patent Firm

(57) ABSTRACT

A method for magnetic resonance imaging is provided that includes using a magnetic resonance imaging system to excite a field of view (FOV) for a target being imaged, using an excitation plan to limit the excited FOV to a relatively narrow band of magnetization, exciting multiple bands of magnetization simultaneously, applying phase encoding along a shortest FOV dimension, acquiring a signal from said simultaneously excited bands of magnetization, and reconstructing and outputting a target image from the acquired signal.

20 Claims, 8 Drawing Sheets

(56) References Cited

U.S. PATENT DOCUMENTS

2016/0154080 A1* 6/2016 Wiens .............. G01R 33/56536
324/309

OTHER PUBLICATIONS

Cunningham, Charles H., and Michael L. Wood. "Method for improved multiband excitation profiles using the Shinnar-Le Roux transform." Magnetic resonance in medicine 42.3 (1999): 577-584.*
Saritas, E. U., D. Lee, and A. Shankaranarayan. "Hadamard slice-encoding for reduced-FOV single-shot diffusion-weighted EPI." Proc. Intl. Soc. Mag. Reson. Med. vol. 17. 2009.*

* cited by examiner

HIGH RESOLUTION MAGNETIC RESONANCE IMAGING WITH REDUCED DISTORTION BASED ON REDUCED-FIELD-OF-VIEW AND GENERALIZED PARALLEL IMAGING

STATEMENT OF GOVERNMENT SPONSORED SUPPORT

This invention was made with Government support under grant EB009055 and EB015891 awarded by the National Institutes of Health. The Government has certain rights in the invention.

FIELD OF THE INVENTION

The present invention generally relates to magnetic resonance imaging. More specifically, the invention relates to a method that combines multi-band excitation, reduced field of view imaging and generalized parallel imaging reconstruction concepts to extend the high-resolution and high anatomical fidelity achievable with reduced FOV imaging over larger FOVs.

BACKGROUND OF THE INVENTION

Single-shot diffusion-weighted echo planar imaging (EPI) is commonly used because of its robustness to motion and high signal to noise ratio (SNR) efficiency. However, the long echo-train readout and narrow effective bandwidth in the phase encode direction make this technique extremely sensitive to T2*-induced decay (blurring) and off resonance, with field inhomogeneities, eddy currents and chemical shift often resulting in severe geometrical distortion. The need for extensive anatomical coverage and high resolution makes EPI-based acquisitions particularly challenging, especially at 3 T, where the increased sensitivity to off-resonance and B1 inhomogeneity cause increased anatomical distortion and shading.

Several high-resolution DWI methods based on echo-planar trajectories have been developed that maximize the velocity of k-space traversal in the phase encode direction to limit distortion and blurring while preserving resolution. Parallel imaging is used extensively with DWI to reduce the effective encoded field of view (FOV), however, coil geometry, noise amplification and residual aliasing limit practical acceleration factors when the FOV is on the order of the phased-array element size or smaller. In multi-shot methods, only a sub-set of k-space lines are acquired following each diffusion-sensitizing period, so that several acquisitions are necessary to fully encode k-space. Additional navigator data or carefully designed, self-navigated trajectories are therefore necessary to correct for shot-to-shot phase inconsistencies caused by physiological and bulk motion. Despite their complexity, the small FOV effectively encoded and short echo spacing achievable with these techniques has been shown to provide excellent resolution and anatomical fidelity, especially in the brain.

Single-shot EPI has been used in conjunction with outer volume suppression pulses, inner volume excitation and 2D RF pulses for high resolution imaging of targeted regions. Some of these methods have been successfully used for imaging the spine, prostate, pancreas, kidneys and thyroids as well as for treatment monitoring in the breast. Due to their limited coverage these techniques are unsuitable for screening purposes. Several groups have recently explored strategies to perform image-space combination of a series of reduced FOV images consecutively acquired to cover the desired FOV. Estimates of the excitation profiles and generalized parallel imaging reconstruction techniques have been shown to allow smooth combination of contiguous volumes with minimal overlap. The main limitation of these methods is that they require a large number of acquisitions to cover the prescribed FOV, which severely limits their applicability outside the brain, where much larger FOVs are often used.

A method that retains the high resolution and anatomical fidelity offered by reduced FOV techniques while extending spatial coverage with the help of generalized parallel imaging concepts could be very beneficial to EPI-based MR applications such as single shot diffusion-weighted EPI.

SUMMARY OF THE INVENTION

To address the needs in the art, a magnetic resonance imaging method is provided that includes using a magnetic resonance imaging system to excite a field of view (FOV) for a target being imaged, using an excitation plan to limit the excited FOV to a relatively narrow band of magnetization, simultaneously exciting multiple bands of magnetization, applying phase encoding over the excited limited FOV along a shortest FOV dimension, simultaneously acquiring a signal from the excited bands of magnetization, and reconstructing and outputting a target image from the acquired signal.

According to one aspect, the invention further includes sweeping across a plurality of multiband excitation patterns in a phase-encoded direction, where the sweeping fills in coverage of gaps within a single the multiband pattern. In one aspect, a corresponding signal is received only by a subset of coil elements that are proximal to the excited FOV band, where reconstruction of the image is performed using a generalized parallel imaging reconstruction method and a calibration method.

In another aspect, the invention further includes limiting the FOV to reduce an echo train length (ETL), where a faster k-space traversal is obtained, where the faster k-space traversal is capable of reducing image distortion, and where T2*-induced blurring is reduced. In one aspect the invention further includes using a 2D RF pulse to limit the FOV. Here, the 2D RF pulse has an echo-planar trajectory, where a fast echo-planar direction during the excitation corresponds to a phase-encode direction, where a slow echo-planar direction during the excitation is a slice-select direction during the imaging, where multiple slices are simultaneously excited, where a fat tissue excitation profile is shifted in the slice-select direction with respect to a water signal. In another aspect, the current embodiment further includes using an inner-volume approach to limit the FOV, where excitation and refocusing pulse volumes are not parallel. According to another aspect, the current embodiment further includes using an outer-volume suppression approach to limit the FOV, where a signal from outside a desired the FOV is suppressed using saturation pulses. In the embodiment where a 2D RF pulse is used to limit the FOV, in-plane multiband excitation patterns are obtained by summing multiple 2D RF pulses after a linear phase modulation of individual the 2D RF sub-pulses. Further, the 2D echo-planar RF excitation pulse and up to a 180° RF refocusing pulse are configured to ensure refocusing of a main lobe of a periodic 2D excitation in a slice-select direction while suppressing a fat tissue excitation signal for each planar simultaneously excited band. In another aspect the 2D RF and up to a multiband 180° refocusing pulse are configured to simultaneously refocus the main lobe and additional side lobes in the slice-select direction.

In yet another aspect, the invention further includes using parallel imaging to resolve the multiple bands.

According to one aspect, the invention further includes using sweeping a pattern to excite a space between the multiple bands, or using parallel imaging to resolve the multiple bands. In one aspect of the current embodiment, a phase encoded FOV is selected to alias the multiple bands directly onto each other. In another aspect of the current embodiment, a phase-encoded FOV is selected to alias the multiple bands imperfectly. In another aspect of the current embodiment, diffusion weighting is applied.

In a further aspect of the invention, the excitation plan includes exciting multiple arbitrary 2D volumes both in plane and through plane. In one aspect of the current embodiment, the excitation follows a grid pattern. In another of the current embodiment, the imaging includes using parallel imaging. In a further of the current embodiment, the excitation follows an arbitrary pattern.

DETAILED DESCRIPTION

Figure 1A:
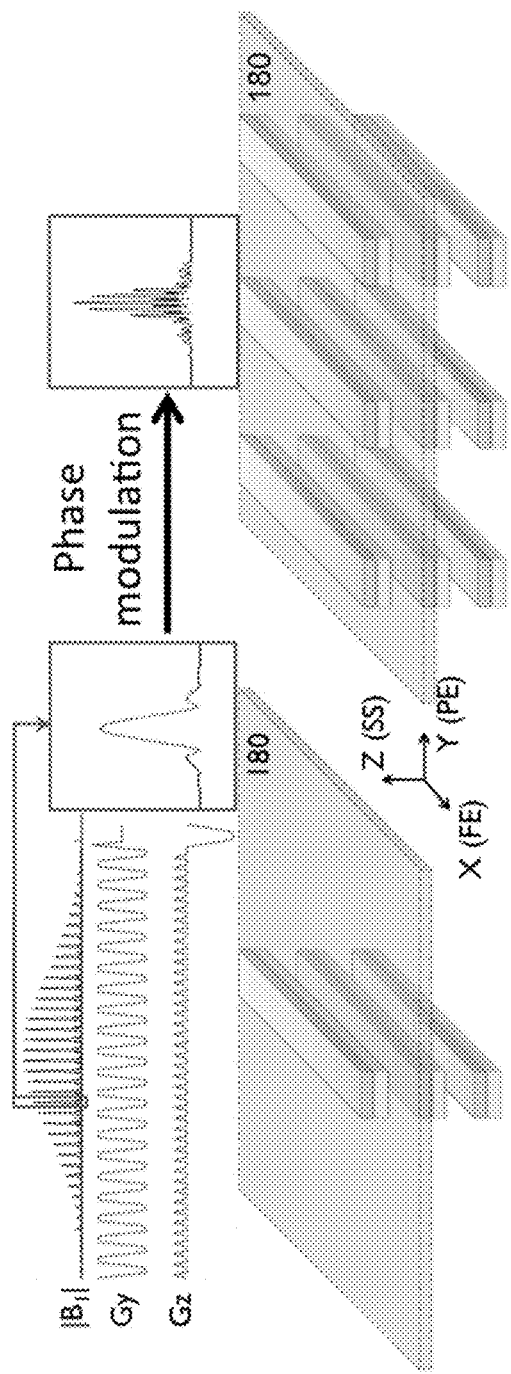
FIGS. 1A-1B show (A) A 2D RF pulse excites a series of narrow bands of magnetization, where if the blipped direction during excitation coincides with the slice-select direction during imaging, each band belongs to a different slice, and due to its chemical shift, fat is displaced in the slice direction so that refocusing the main excitation lobe alone ensures suppression of unwanted signals originating from fat and other excitation side lobes, and by phase modulating the individual sub-pulses, multiple coplanar bands can be simultaneously excited within each slice; (B) the effectively encoded FOV cover the width of a single band, where multiple excitations, with the same multiband pattern shifted in the phase encode direction on each new excitation, are used to cover the prescribed FOV, and if the distance between the bands is comparable to the distance between the physical receiver elements of a multichannel array coil, signals originating from different bands can be resolved using parallel imaging, according to one embodiment of the invention.
Figure 1B:
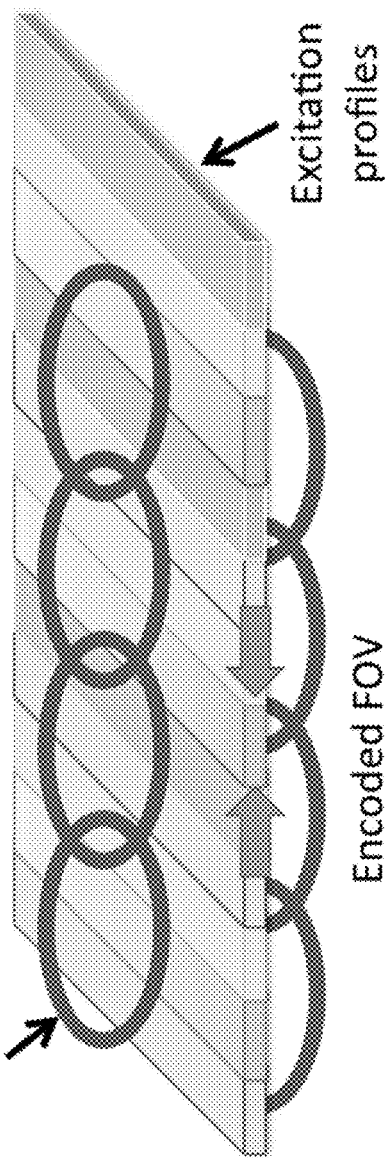

The current invention provides a method using a magnetic resonance imaging system for magnetic resonance imaging that combines multi-band excitation, reduced field of view (FOV) imaging, and generalized parallel imaging reconstruction methods to extend the high-resolution and high anatomical fidelity achievable with reduced-FOV techniques over much larger FOVs. Some key aspects of the current invention include simultaneous excitation and imaging of multiple reduced-FOV bands, where the excitation pattern can include multiple simultaneously excited bands that are in-plane, or both in-plane and through-plane, and where additional regions can be simultaneously excited by separate excitations. The method of excitation to limit the FOV includes use of a 2D-selective excitation pulse, use of "inner-volume" excitation/refocusing combinations or use of outer-volume suppression. Further, simultaneous multiband excitation can be accomplished using modulated excitations or by exploiting the inherent excitation sidelobes of a 2D-selective excitation when this method is used to limit the FOV.

Further key aspects of the current invention include resolving signals in multiple bands using phase encoding alone, resolving the signal in multiple bands using a POMP (Phase Offset Multi-Planar) scheme, that includes using a 2D excitation RF pulse and a 1D multiband refocusing RF pulse, or 1D multiband excitation and refocusing pulses, to excite and refocus several slices at once, which are then unaliased during image reconstruction, resolving multiple simultaneously-excited bands using parallel imaging, combining signals from separately excited bands using parallel imaging, or combining signals from separately excited bands using complex addition or magnitude addition.

According to the current invention, the shorter echo train length (ETL) allowed by this reduced FOV method results in faster k-space traversal. According to one embodiment of the invention, where an echo-planar k-space trajectory is used, this results in lower distortion and T2*-induced blurring for a given resolution. According to another embodiment of the invention, where a spin-echo-train readout is used, this results in reduced blurring due to T2 decay.

According to one embodiment of the invention, a 2D RF pulse is used to limit the excited FOV to a narrow band of magnetization. By phase modulating the individual sub-pulses, multiple bands can be excited at once. According to another embodiment of the invention, a slice-selective RF pulse used in conjunction with a phase-modulated slab-selective refocusing pulse, where slice-select and slab-select directions do not coincide, can be used to simultaneously excite multiple narrow bands of magnetization. According to yet another embodiment of the invention, multiple bands of magnetization can be simultaneously saturated before the start of the main acquisition pulse sequence, resulting in the effective excitation of a series of simultaneously excited narrow bands of magnetization.

According to the current invention, phase encoding is performed along the shortest dimension of a single excited band of magnetization. According to one embodiment, where phase encoding covers a FOV that matches the width of a single excited band, multiple simultaneously excited bands fold directly onto each other. According to another embodiment, where phase encoding covers a FOV that is either larger or smaller than the width of a single excited band but smaller than the maximum extent of the object being imaged, multiple simultaneously excited bands alias imperfectly onto each other. In yet another embodiment, where phase encoding covers at least the extent of the object being imaged, no aliasing of multiple simultaneously excited bands occurs.

When phase encoding covers a smaller FOV than the maximum extent of the object being imaged, multiple simultaneously excited bands fold onto each other. However, if the distance between the bands is comparable to the distance between the physical receiver elements of a multichannel array coil, signals originating from different bands can be resolved using parallel imaging.

According to one embodiment of the invention, an in-plane multiband excitation pattern is sufficient to capture the anatomy of interest (e.g. two coplanar bands of magnetization, each covering one breast, can be used for breast MRI). According to another embodiment, the desired anatomical coverage is obtained by sweeping the multiband excitation pattern in the phase encode direction, effectively filling in gaps produced by the first excitation.

In one embodiment of the invention, multiple excitations can be combined by complex or magnitude summation after parallel imaging reconstruction is used to resolve signals originating from each excitation. In another embodiment, signals originating from each excitation can be resolved using parallel imaging and different excitations can be subsequently combined using similar parallel imaging concepts, where coil sensitivities are replaced by RF excitation profiles. In yet another embodiment of the invention, a generalized parallel imaging reconstruction strategy (described below) and a specifically designed calibration procedure (described below) can be used to resolve signals originating from simultaneously excited bands while efficiently combining different strips of magnetization into a composite image with minimal artifacts between adjacent bands.

Details of one embodiment of the invention, where diffusion weighting is applied, are provided herein. In this exemplary embodiment, a 2D echo-planar RF pulse is used to produce a 90° flip angle over a 4 cm slab of magnetization and the specified slice thickness. The fast echo-planar direction during excitation corresponds to the phase-encode (PE) direction during imaging. A time-bandwidth (TBW) product of 6 in the PE direction gives minimal aliasing with an effective encoded FOV of 4 cm. The slow ("blipped") direction of the excitation is in the slice-select (SS) direction. As a result, multiple slices are simultaneously excited (periodic excitation side-lobes) and the fat excitation profile is shifted in the SS direction with respect to the water signal (see FIG. 1A). The pulse is designed so that there is no overlap between the fat and water profiles for $B_0 \geq 1.5$ T (42 sub-pulses, 376 us each, $TBW_{SS}=3.1$). A 180° refocusing pulse (pulse width=3.6 ms; BW=806 Hz) with selectivity along SS direction used in conjunction with the 2D RF pulse ensures refocusing of the main lobe of the periodic 2D excitation while suppressing fat. It is understood that the refocusing pulse can be less than 180°. The duration of the 2D RF pulse (16.6 ms) is minimized by transmitting during both gradient polarities. In-plane multiband excitation patterns are obtained by summing multiple 2D RF pulses after linear phase modulation of the individual sub-pulses. In one embodiment, three bands at a time can be excited with a peak B1 of 0.19 Gauss.

Diffusion weighting is applied by playing encoding gradients immediately before and after the 180° refocusing pulse. A Stejskal-Tanner diffusion encoding scheme with gradients simultaneously played on all 3 axes is used to minimize TE for a given b value. A conventional half-Fourier EPI readout with 24 lines on the non-fully-sampled side of ky is used to further reduce TE. Ramp sampling and the maximum readout gradient amplitude (50 mT/m) are used to minimize the echo spacing (ESP). The effective encoded FOV is controlled by the phase encode acceleration factor. For a given resolution, the ETL is minimized when the effective encoded FOV is matched to the width of a single excited band.

The acquisition includes a reference scan, integrated into prescan, during which the phase encoding blips are turned off, and the actual acquisition, which includes several passes, with the multiband excitation pattern progressively shifted in the phase encode direction to excite spaces between bands. The number of passes depends on the desired phase-encode-direction FOV and the number of bands simultaneously excited, which in turn depends on the specific geometry of the multichannel array coil used for signal reception. In the breast, where performance of the current invention is evaluated, coil sensitivities vary the most in the right-left direction. With a 16-channel array coil and 3 simultaneously excited bands, assuming a 20% overlap between consecutive bands, four passes are required to cover a 35 cm FOV. The periodic excitation limits the maximum number of slices per TR to as many can fit within two adjacent side lobes (16 slices). If more slices are needed, two acquisitions need to be performed, which doubles scan time.

Because of the in-plane multiband excitation, reducing the FOV to match the width of a single band results in aliasing, which can be resolved using a generalized parallel imaging reconstruction. In conventional image-based parallel imaging, a fully sampled, low resolution, proton-density acquisition is used to measure sensitivity maps. Here the sensitivity of multichannel coils (each coil element "sees" only part of the object being imaged) and the spatially localized selectivity provided by the multiband excitation pattern (different bands "see" different parts of the object being imaged) effectively complement each other. In this embodiment of the invention, if Nc is the number of physical receiver coils and Np is the number of passes necessary to sweep the prescribed FOV, with each pass having a unique multiband excitation pattern, the total number of "virtual" coils is Nc×Np. Similarly to conventional imaged-based parallel imaging, "virtual" coil sensitivity maps are measured by performing a low resolution, fully sampled EPI calibration scan with the same multiband excitation pattern and the same number of passes used for the actual acquisition. Ideally, the rate of k-space traversal should be the same for calibration and accelerated data, so that the distortion field is consistent across the two acquisitions. This would require a multi-shot EPI calibration scan with as many segments as the FOV reduction factor used in the accelerated scan. However, when imaging the breast, cardiac pulsation prevents the use of multi-shot methods for calibration. As cardiac gating is clinically impractical, the ESP used for calibration is reduced by the same reduction factor applied to the imaging FOV in the actual scan. While this often allows exact matching of the rates of k-space traversal between calibration and actual acquisition, there are cases when perfect matching cannot be achieved (e.g. low resolution and high acceleration/FOV reduction factors) that could potentially result in reconstruction errors.

The spatial sensitivity produced by the 2D multiband excitation pattern varies much more rapidly than the spatial sensitivity associated with physical receiver coils. In order for the calibration to correctly resolve these variations, sufficiently high spatial frequencies need to be sampled in the phase encode direction. In a perfectly homogeneous phantom, using the same phase encoding matrix size for calibration and actual acquisition gave the lowest artifact level at the intersection between adjacent bands. However, in vivo, a calibration phase encoding matrix size of 64 was found to be the best compromise between being able to resolve the sharp transition regions produced by the 2D excitation, while limiting the amount of anatomical detail in the calibration data.

In one embodiment of the invention, an image-space-based (SENSE) parallel imaging reconstruction method is used. Because the same aforementioned multiband 2D RF pulse is used to acquire the calibration data, fat is inherently suppressed. With SENSE, in order to avoid inaccurate sensitivity map estimation in the low SNR regions resulting from fat suppression, the same calibration scan is repeated at the fat frequency and combined with the corresponding data at the water frequency to estimate sensitivity maps. In addition, sensitivity maps are normalized using full-excitation-FOV images (i.e. single-band 2D excitation covering the prescribed FOV) acquired as part of the calibration procedure. This avoids artifacts that would occur at the intersection between adjacent bands when taking the sum of squares of the individual "virtual" coil images, due to the sharp transition regions in the multiband excitation profile. The total calibration duration required for image-based parallel imaging is (2×Np+2)×TR (~30 s for TR=3 s and 4 passes).

In another embodiment of the invention, a k-space-based (ARC) parallel imaging reconstruction method is used. In this case a single multiband, multi-pass calibration scan performed at the water frequency is sufficient to acquire a pseudo "auto-calibration" region. The total calibration duration required for k-space-based parallel imaging reconstruction is Np×TR (~12 s for TR=3 s and 4 passes).

For the specific embodiment described herein, image reconstruction includes the following steps:

Step 1: Phase Correction and Ramp Sampling Correction of Calibration Data

Zero- and first-order phase correction terms to remove Nyquist ghosts are estimated using an iterative, entropy-driven minimization technique to avoid acquiring a separate reference scan for the calibration data. After phase correction, gridding of the non-uniform k-space data resulting from ramp sampling is performed. Phase and ramp sampling correction are performed separately for all calibration datasets (4 datasets for image-based, a single dataset for k-space-based parallel imaging reconstruction).

Step 2: Sensitivity Maps Estimation (Only Required for Image-Based Parallel Imaging Reconstruction)

All the calibration datasets (multiband and full-excitation-FOV at the water and fat frequency) are inverse Fourier transformed and interpolated to the same resolution of the actual acquisition after summation of the corresponding water and fat data. Sensitivity maps are estimated by dividing each "virtual coil" image by the corresponding coil-combined (sum of squares), full-excitation-FOV image, similarly to conventional SENSE reconstruction where each coil image is divided by the sum of squares of all the coil images. Regions containing pure noise are identified by thresholding and density filtering of the coil-combined full-excitation-FOV image. An extrapolation region is defined by region growing.

Step 3: Phase Correction and Ramp Sampling Correction of Accelerated Data

Phase correction (Nyquist ghost removal) of the accelerated data is performed by applying zero- and first-order phase terms derived from the reference scan data to every k-space line. Phase correction coefficients are obtained on a coil-by-coil basis. The same coefficients, corresponding to the channel with the highest SNR, are applied to all receivers. Ramp sampling correction is performed by conventional gridding of each acquired echo following phase correction.

Step 4: Parallel Imaging and Partial Fourier Reconstruction

Homodyne reconstruction removes all image phase, including that from the receive B1 field. In the embodiment where an image-based parallel imaging approach is adopted, a generalized SENSE reconstruction with partial Fourier homodyne reconstruction is used to preserve the B1 field phase so that the unaliased spin distribution can be recovered before phase removal by homodyne detection. Each acquisition (signal average) is reconstructed separately. The undersampled, partial Fourier data is pre-weighted by a cosine-tapered ramp that effectively doubles the conjugate of missing data. SENSE reconstruction is performed separately for the pre-weighted data and after low-pass filtering the original data. The final unaliased image is obtained by taking the real part of the SENSE-reconstructed pre-weighted k-space after removing the phase obtained by performing SENSE reconstruction on the low-pass filtered k-space data.

In the embodiment where a k-space based parallel imaging reconstruction method (ARC) is used, partial Fourier reconstruction can be effectively decoupled. Each acquisition (signal average) is reconstructed using ARC (kernel size=2×acceleration factor; regularization factor=0.001), followed by conventional homodyne reconstruction. Homodyne removes the low-varying image phase that could include unwanted terms due to motion occurring during the diffusion-sensitizing period. Real-valued averaging is performed for each b value for both SENSE and ARC reconstructions to minimize the noise bias resulting from magnitude averaging. The resulting "virtual coil" images, after ARC reconstruction and real averaging, are combined using a sum-of-squares combination.

A series of phantom experiments was performed using a simple spin-echo acquisition to illustrate the key points of the invention without the complicating factors inherent to EPI (phase correction, gridding, distortion). The purpose of these experiments was: 1. To show that multiple multiband excitation patterns allow undersampled datasets to be reconstructed using a generalized parallel imaging approach, even when only a single channel is available. 2. To show that conventional parallel imaging in conjunction with multiple multiband excitation patterns can allow higher undersampling factors than parallel imaging alone.

Spin echo images (TR=300 ms, TE=14 ms, FOV=24 cm, slice thickness=5 mm, matrix size=256×256, bandwidth (rBW)=15.6 kHz) of a cylindrical resolution phantom were acquired using a single-channel, transmit/receive and an 8-channel, receive-only head coil. "Virtual" coil images were obtained by multiplying each coil image by the simulated excitation profile produced by the multiband 2D RF pulse described above. Multiband factors of 2 and 3 (2 and 3 coplanar bands, progressively shifted by (FOV−FWHM)/(Nb−1) each time, to cover the whole FOV, where FWHM is the full width at half maximum and Nb is the total number of excited bands) were simulated (distance between adjacent bands=11.3 cm and 7.6 cm, respectively), together with undersampling factors ranging between 2 and 16. Images were reconstructed using the generalized SENSE approach described previously, with sensitivity maps obtained from the simulated excitation profiles. For multi-channel datasets, conventional sensitivity maps, calculated by dividing each low-resolution coil image (obtained by low-pass filtering the corresponding k-space data) by the sum of squares of all coil images, were multiplied by the simulated excitation profiles to obtain Nc×Np sensitivity maps. For single-channel data, the Np multiband excitation profiles were used as sensitivity maps.

Unlike many cases, where undersampling is used to speed up the acquisition, the main purpose of undersampling in EPI-based acquisitions is to reduce off-resonance-induced distortion by reducing the echo train length. Therefore, the use of multiband in conjunction with EPI and conventional parallel imaging allows shorter echo train lengths (i.e. reduced distortion) or higher resolution while maintaining the same level of distortion, at the expense of longer acquisition times. This point was demonstrated in vivo, as described herein.

Healthy volunteers were scanned using a 16-channel bilateral array coil (Sentinelle Medical, Inc, Toronto, ON, Canada). A multiband factor of 3 (distance between adjacent bands=12.8 cm, 4 passes with 32 mm increment between consecutive passes) was used to acquire three datasets with progressively higher resolution while maintaining the same level of distortion and blurring. All datasets shared a 40 cm FOV and 16 4 mm-thick axial slices. Matrix sizes of $256^2$, $382^2$ and $512^2$ were used for the first, second and third dataset respectively, with corresponding undersampling factors R=4, 6 and 8. Other imaging parameters, common to all datasets were: TE=55 ms, TR=3000 ms, ETL=40 (8 extra k-space lines for partial Fourier), b values=0 (8 signal averages) and 600 s/mm² (16 signal averages). In-plane resolutions of $1.56^2$, $1.00^2$ and $0.78^2$ mm² were obtained.

The total acquisition time was the same for all datasets (4 min. 50 sec.). For comparison, the first dataset was reconstructed using both SENSE and ARC. As our implementation of ARC gave better image quality than SENSE, while requiring a much faster calibration, the remaining datasets were reconstructed using ARC only.

Corresponding full-excitation-FOV images with the same imaging parameters were acquired for comparison.

Fourteen patients with known breast lesions were scanned using a 16-channel breast coil (Sentinelle Medical, Inc, Toronto, ON, Canada). Imaging parameters were set to test the hypothesis that the proposed multiband technique can achieve the same image quality and same high resolution of clinically available reduced-FOV methods, but with whole bilateral coverage. A 0.78×0.78×4 mm³ resolution was obtained with the proposed multiband method (MB factor=3, 4 passes to cover a 40 cm FOV, distance between adjacent bands=12.6 cm, 512×512 matrix size, 8×undersampling factor, TE=55 ms, TR=3000 ms) and reduced FOV DWI (10×5 cm² FOV, 128×64 matrix size, TE=51 ms, TR=3000 ms). Conventional DWI with a resolution of 1.3×1.3×4 mm³ was performed for comparison using the clinical protocol routinely used at our institution (34 cm FOV, 256×256 matrix size, 4×parallel imaging acceleration, TE=92 ms, TR=3000 ms). Two b values, b=0 (8 signal averages) and b=600 s/mm² (16 signal averages), half Fourier and targeted shimming (bilateral, i.e. separate shim boxes over each breast, for multiband and conventional DWI, matching the prescribed rectangular FOV for reduced FOV) were used. The scan time for 16 axial slices was 1 min. 12 sec. for conventional and reduced FOV DWI and 4 min. 50 sec. for the proposed multiband method.

An experienced radiologist reviewed all images in randomized order during different sessions to enable comparison of diagnostic accuracy between series, while minimizing memory effects. Images were scored for a) level of distortion; b) residual aliasing; c) quality of fat suppression; d) perceived SNR and e) anatomical detail on a 5 point scale (1=worst, 5=best). Statistical significance (set at p<0.05) was tested using the Wilcoxon signed-rank test.

Figure 2A:
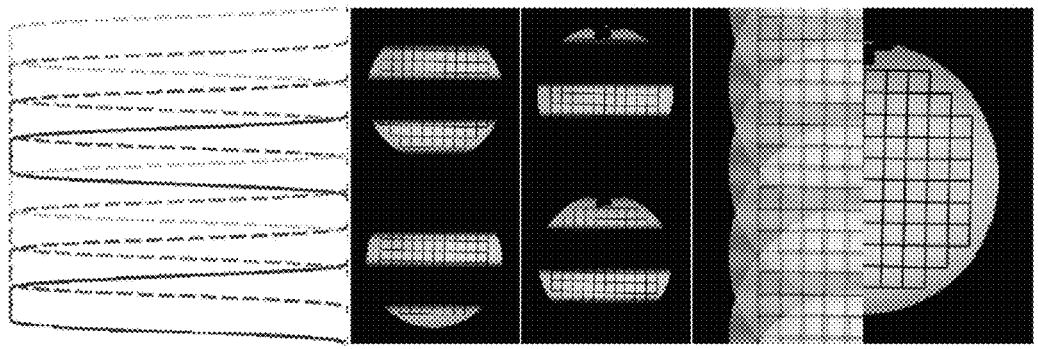
FIGS. 2A-2C show reference spin echo image and simulated excitation profiles for: multiband (MB) factor=3 with 2 excitations (A Top row), MB factor=2 with 3 excitations (B Top row) and MB factor=2 with 4 excitations (C Top row); corresponding "virtual" coil images (as many as the number of excitations necessary to sweep the whole FOV) obtained by multiplying the reference spin echo image and each excitation profile. Bottom row: each virtual coil image is undersampled (R=2 (A Middle row), 2 (B Middle row) and 4 (C Middle row)) and reconstructed by performing a simple inverse Fourier transform followed by sum of squares (top had and by using the proposed generalized SENSE reconstruction (bottom half), according to one embodiment of the invention.
Figure 2B:
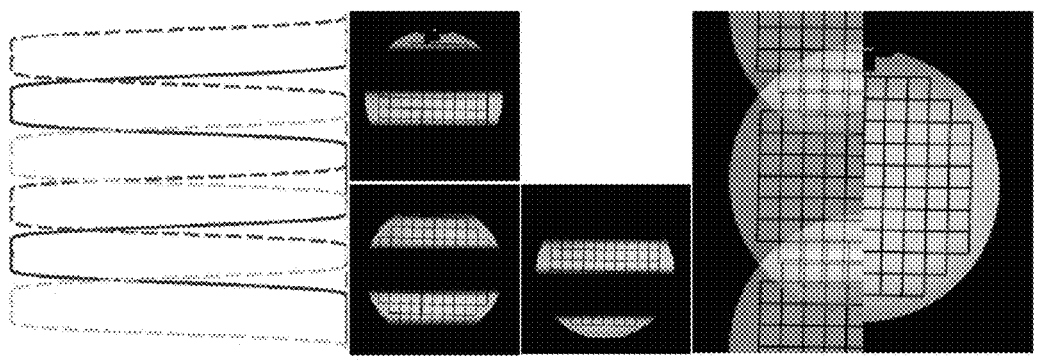
Figure 2C:
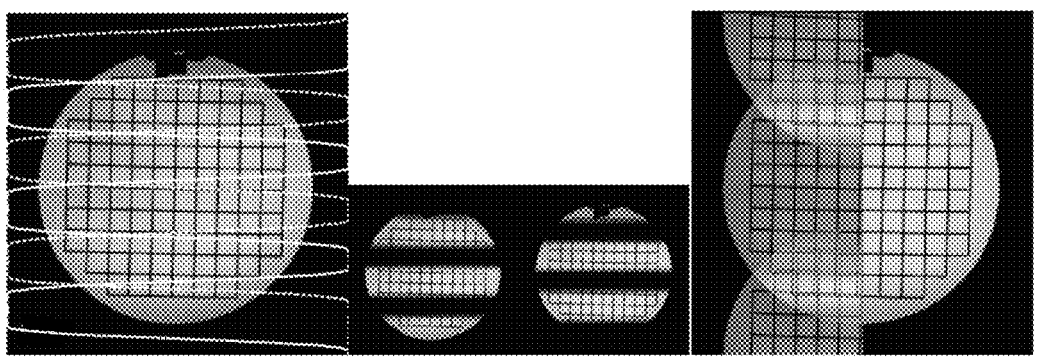
Figure 3:
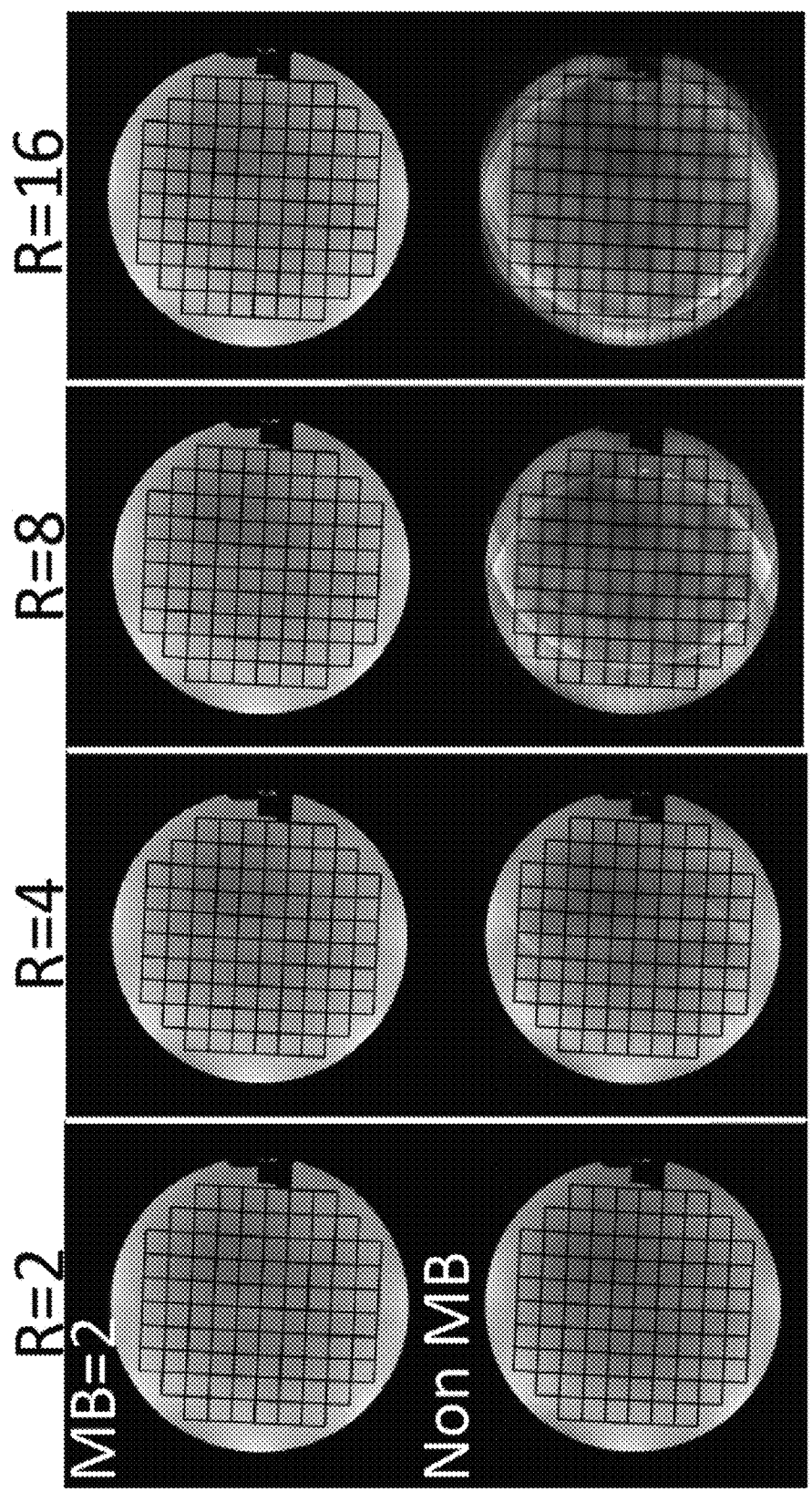
FIG. 3 shows Multiband (top row) and non-multiband reconstructions (bottom row) of retrospectively undersampled spin echo datasets acquired with an 8-channel receive-only head coil using generalized and conventional SENSE, where the use of multiband in conjunction with parallel imaging allows greater FOV reduction factors than parallel imaging alone, according to one embodiment of the invention.

FIG. 2A shows a reference spin echo image acquired with a single-channel head coil and simulated excitation profiles obtained using the multiband 2D RF pulse described above. Two "virtual" coil images (middle row) were obtained by multiplying each excitation pattern by the reference image. Each "virtual" coil sees a different part of the object being imaged, so that a generalized parallel imaging method, where each "virtual" coil is treated as if it was a physical receiver coil, can be used to reconstruct retrospectively undersampled datasets. The bottom row of FIG. 2A compares sum-of-squares (top half) and SENSE (bottom half) reconstructions of a 2×undersampled dataset. Artifacts at the boundaries between adjacent bands are barely visible, as expected in the ideal case where sensitivity maps are perfectly known, but with sum-of-squares the expected aliasing appears. In FIG. 2B, three excitations, with two simultaneously excited bands, covered the desired FOV. In this case there was almost no difference between this acquisition scheme and that shown in FIG. 2A, probably due to the high SNR of the reference spin echo image. However when multiple receiver coils are used for signal reception, the optimal spacing between consecutive bands depends on the geometry of the array coil and the number of excitations required is determined by the prescribed FOV. As in conventional parallel imaging, the maximum achievable acceleration factor is limited by the number of coils available. Here, in order to successfully reconstruct a 4×undersampled dataset, at least 4 different excitations were necessary, as shown in FIG. 2C, to avoid any single band aliasing onto itself. FIG. 3 shows images obtained using the same spin-echo acquisition and an 8-channel head coil. Non-multiband images were obtained by conventional SENSE reconstruction of retrospectively undersampled datasets. Parallel imaging artifacts were visible for R=4 and became unacceptable for R=8. Multiband images were obtained by simulating a multiband factor of 2, with 3 excitations to cover the desired FOV (see FIG. 2B). In this case, 3 (Np)×8 (Nc)=24 "virtual" coils successfully resolved aliasing up to R=16, demonstrating that multiple multiband excitation patterns can be used to extend the parallel imaging capabilities of conventional coils at the expense of increased acquisition time. This is a useful concept for EPI acquisitions, where the ability to reduce the effectively encoded FOV beyond the parallel imaging capabilities of commercially available receiver coils offers a means to either further reduce distortion or increase resolution while maintaining the same degree of anatomical fidelity.

Figure 4:
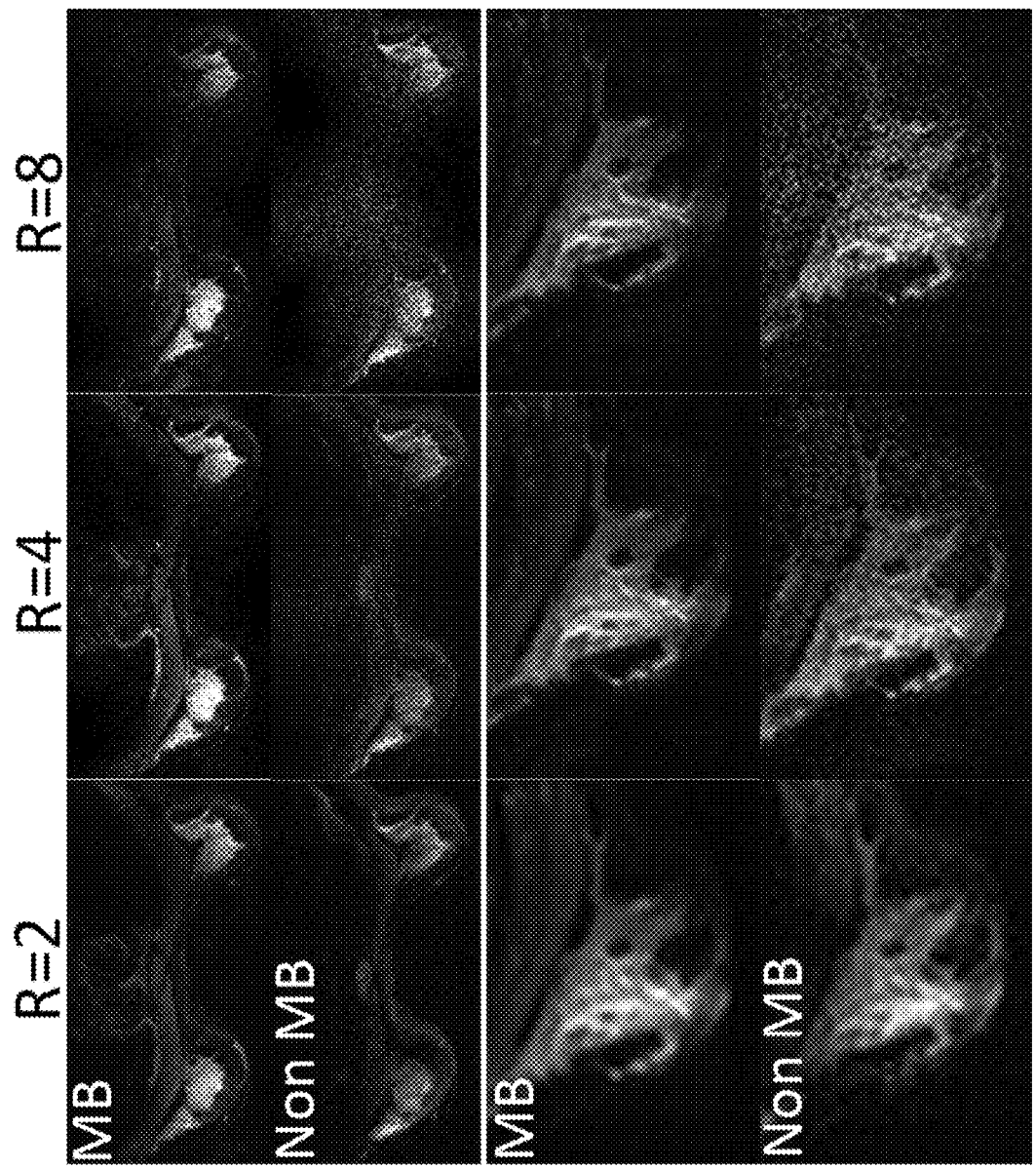
FIG. 4 shows multiband and non-multiband images acquired in a healthy volunteer with different FOV reduction factors while varying resolution to maintain the same echo train length (ETL), where by progressively reducing the effectively encoded FOV, it is possible to obtain progressively higher resolution images while maintaining the same level of off-resonance-induced distortion and blurring (cfr. close up view of right breast), and at higher FOV reduction factors, non-multiband images are non-diagnostic due to noise amplification effects, where by using multiband together with conventional parallel imaging reduces these effects, allowing higher undersampling factors than using parallel imaging alone, according to one embodiment of the invention.
Figure 5:
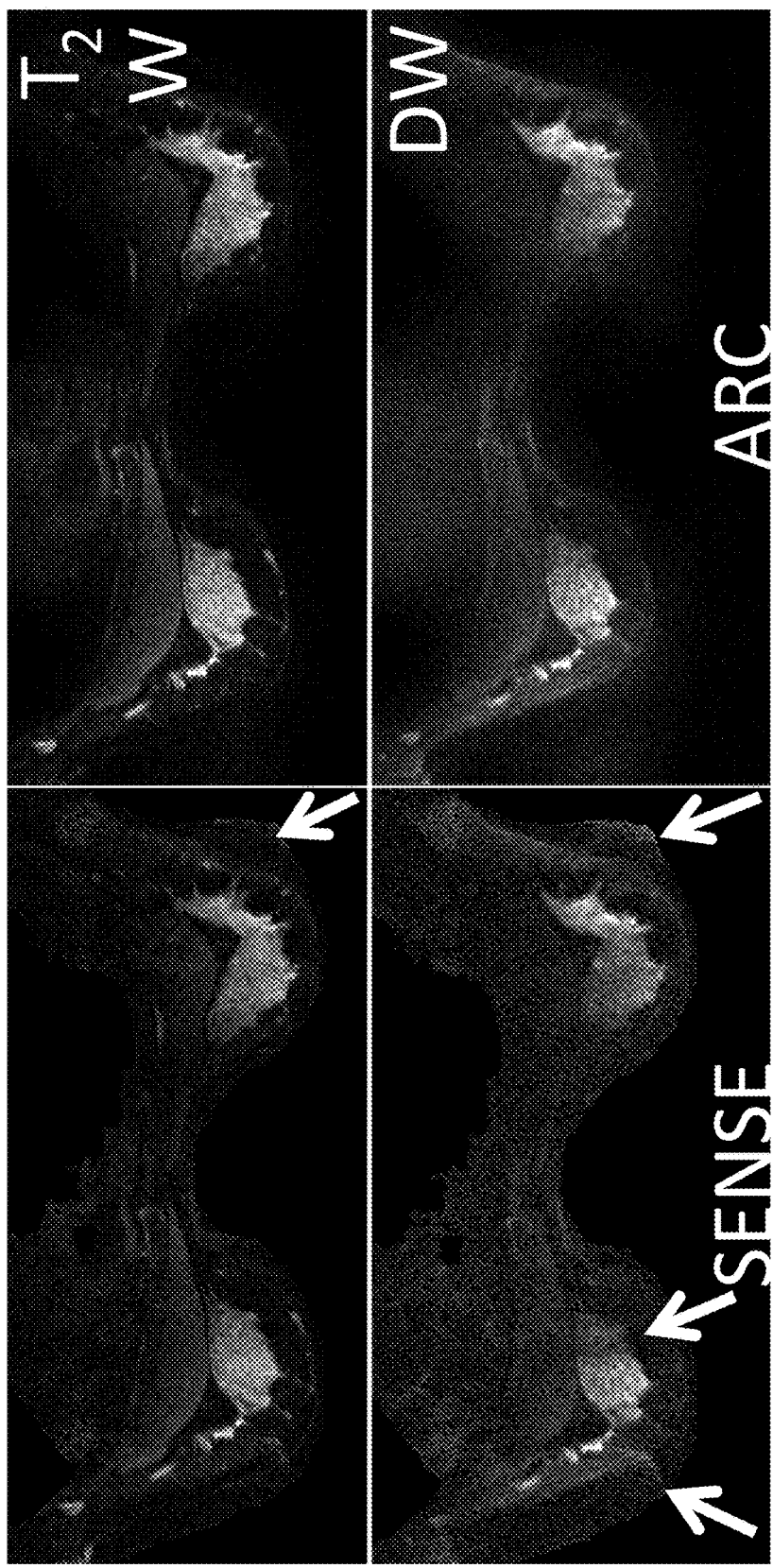
FIG. 5 shows generalized SENSE and ARC reconstructions of multiband images acquired in a healthy volunteer, according to one embodiment of the invention.

FIG. 4 shows MB and non MB EPI images (b=0) acquired in a healthy volunteer. While both multiband and non multiband images could be successfully reconstructed up to a FOV reduction factor of 8 (i.e. 8×undersampling), the SNR penalty associated with progressively higher undersampling factors was much more evident in the non multiband images. This is evident from the close up view in the lower half of FIG. 4, where detail of the left breast of a different volunteer is shown. Also, note the improved fat suppression due to the combination of the 2D RF and 180° refocusing pulse in the MB images when compared to conventional EPI, with fat suppression performed using a conventional spatial-spectral excitation pulse. FIG. 5 shows b=0 and b=600 s/mm² images acquired with a multiband factor of 2 and a FOV reduction factor of 4 and reconstructed using image-space and k-space-based parallel imaging. SENSE-based reconstructions showed more residual aliasing and overall worse image quality than the corresponding ARC-based reconstructions, especially in slices where large amounts of fat tissue were present.

Figure 6:
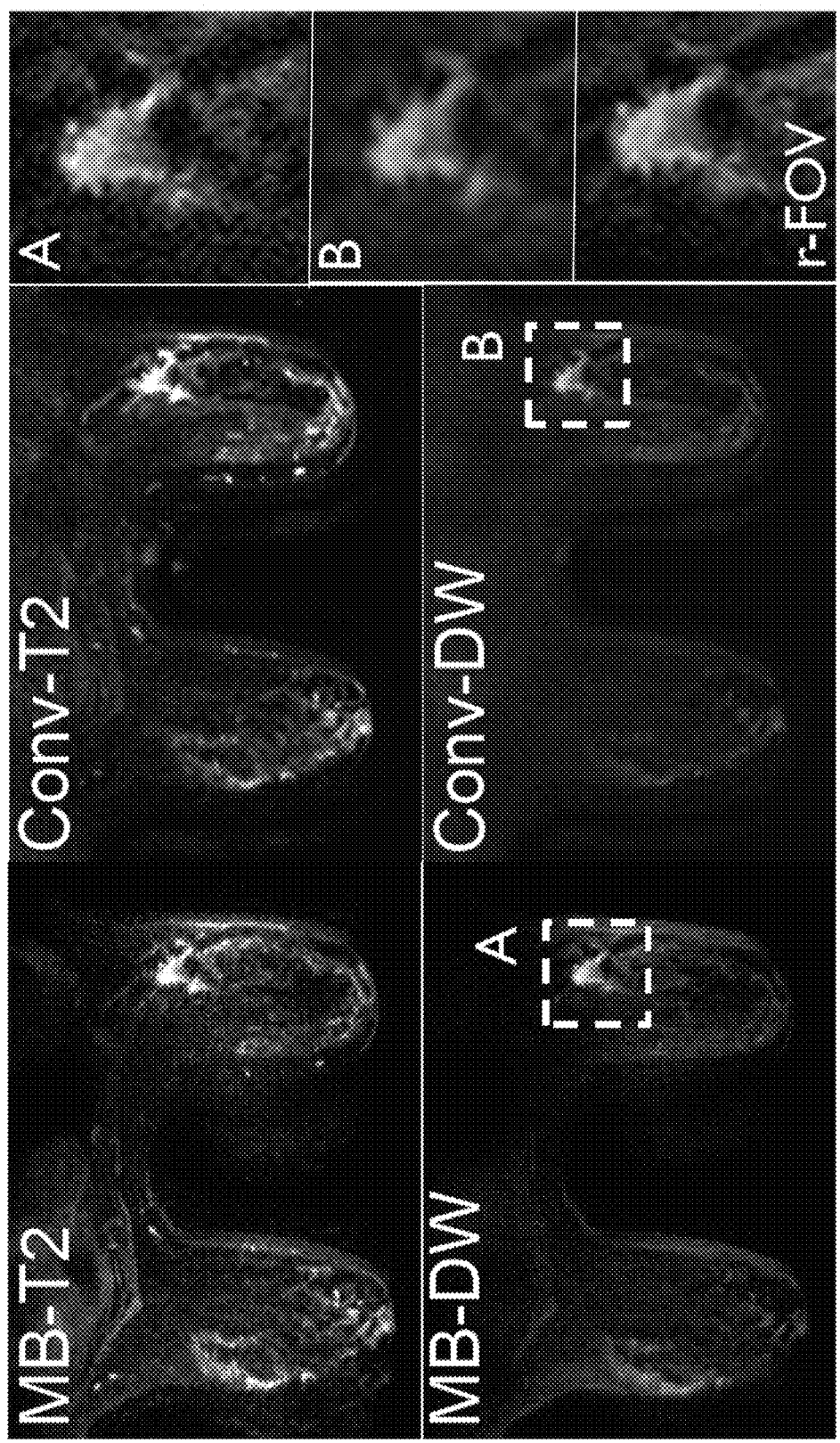
FIG. 6 shows b=0 and b=600 s/mm$^2$ images acquired in a patient with a known breast lesion using multiband and non-multiband DWI, where the similar distortion field between the multiband and non-multiband acquisitions and the increased resolution achieved with multiband (insert A), similar to that achieved using a targeted reduced FOV method (r-FOV), with respect to non-multiband (insert B), according to one embodiment of the invention.
Figure 7:
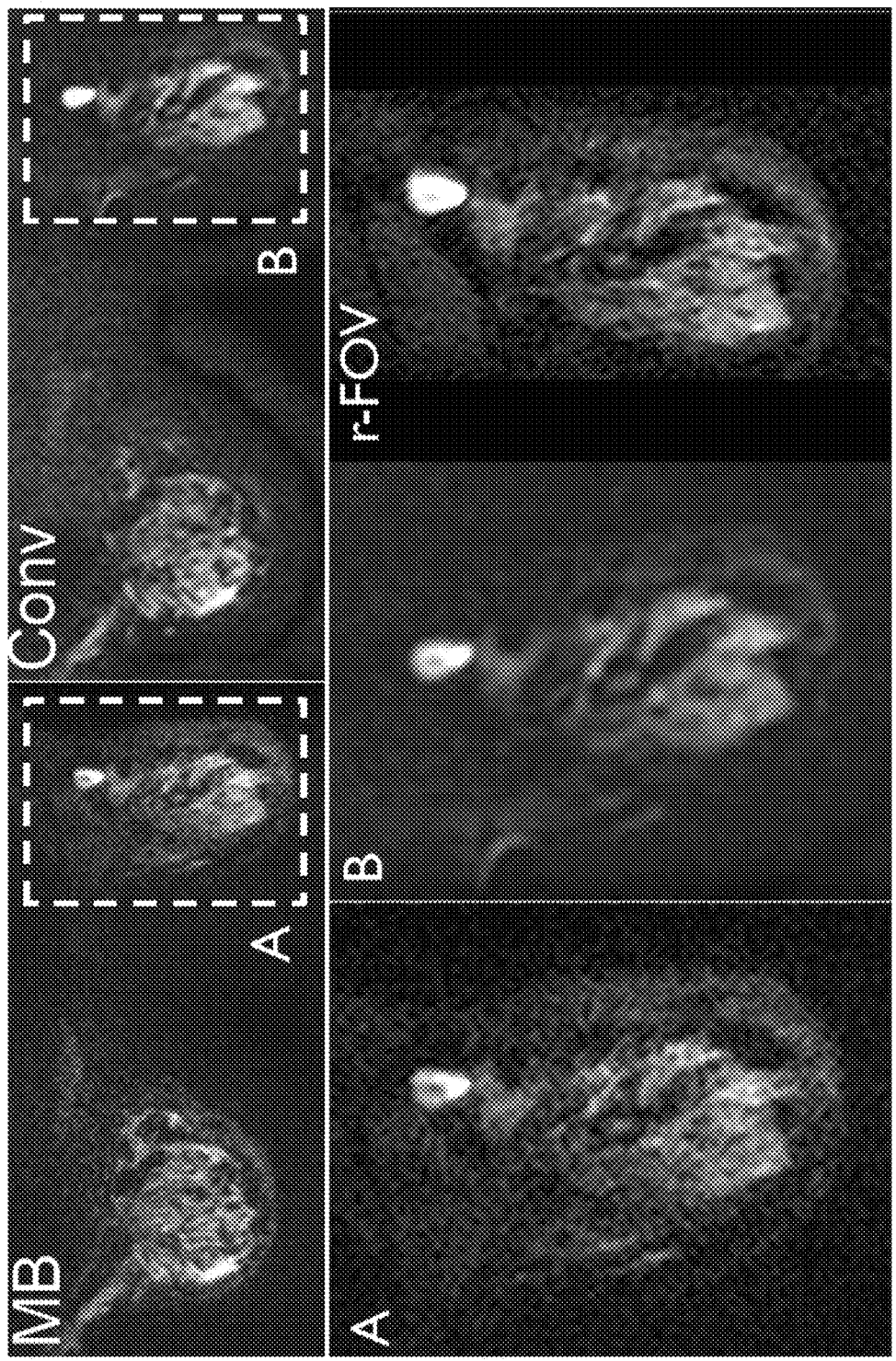
FIG. 7 shows b=600 s/mm$^2$ images acquired in a patient with a known breast lesion using multiband and non-multiband DWI, where the similar distortion field between multiband and non-multiband images and the increased resolution achieved with multiband (insert A) with respect to non-multiband (insert B), and the same resolution achieved using a targeted reduced FOV method (r-FOV) is obtained with whole bilateral coverage using the proposed multiband method, according to one embodiment of the invention.
Figure 8:
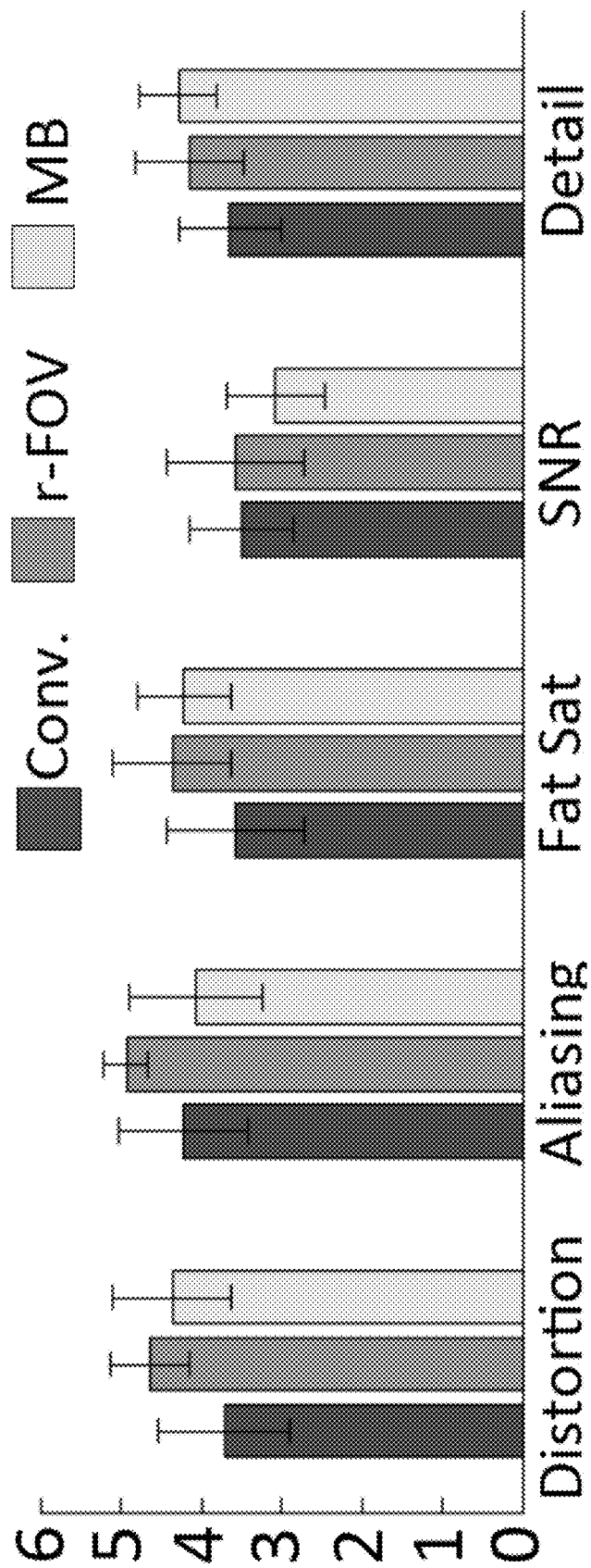
FIG. 8 shows a qualitative evaluation of conventional (non-multiband), multiband and reduced FOV DWI in terms of overall distortion, residual aliasing, quality of fat suppression, perceived SNR and anatomical detail, according to one embodiment of the invention.

Multiband, conventional and reduced FOV DWI images were successfully acquired in all patients. FIG. 6 and FIG. 7 show bilateral images obtained with MB and conventional DWI as well as reduced-FOV DWI. Overall, there was no difference between multiband and reduced-FOV DWI in terms of distortion (p=0.4), quality of fat suppression (p=0.7), perceived SNR (p=0.1) and anatomical detail (p=0.7) (FIG. 8). Minor residual aliasing was noted in multiband but not in reduced FOV (multiband parallel imaging factor=8 vs. no parallel imaging for reduced FOV). With respect to conventional DWI, multiband images were less distorted (p=0.03) and were found to be superior both in terms of anatomical detail (p=0.02) and fat suppression (p=0.03). Perceived SNR and level of residual aliasing were not significantly different.

Parallel imaging remains the most widely used method to reduce distortion and blurring in high-resolution DWI. However, commercially available array coils or the need to image deep within the body often limit the maximum acceleration factor achievable with this technique. Readout-segmented methods, used in conjunction with parallel imaging, can further reduce distortion by reducing ESP, although longer acquisition times often result from acquiring several blinds, and k-space traversal is less efficient. The current invention, similarly to readout-segmented methods, can be used in conjunction with conventional parallel imaging techniques to allow reduced distortion at the expense of longer scan times. Unlike readout-segmented EPI, the current invention is essentially a single-shot technique. In multi-shot methods, a series of k-space segments are acquired following different excitations, causing different motion-induced phase errors to affect different segments. In the current invention, the whole k-space, though undersampled, is acquired following each excitation, so that each shot can be directly Fourier transformed to obtain a partial (due to the multiband excitation) and aliased (due to undersampling) representation of the object being imaged. While different excitations are necessary to sweep the prescribed FOV, meaning that phase inconsistencies are inevitably present between different shots, these are automatically accounted for and compensated by a generalized parallel imaging reconstruction where each of these images is regarded as if it originated from a different receiver coil. In k-space based methods coil images are reconstructed separately and then combined using sum of squares. Image-domain methods generally combine the phase information from different coil elements, however, the use of homodyne reconstruction effectively removes unwanted phase inconsistencies in the combined images. Bulk motion between shots can still produce artifacts at the junction between consecutive bands. While compressed breast tissue is almost motion-free, inter-shot motion due to cardiac pulsation and/or breathing is likely to be one of the main factors to be accounted for in abdominal imaging. In one embodiment of the invention, conventional motion-compensating strategies like cardiac gating and/or respiratory triggering, as well as the use of navigator echoes are used to mitigate the effect of physiological motion.

The current invention can be used for high resolution DWI of the breast to obtain bilateral coverage with similar resolution and anatomical fidelity as those recently achieved over targeted regions using reduced FOV methods. In the breast, with a 16 channel receive coil, the maximum FOV reduction factor was essentially limited by SNR considerations. Another potential problem associated with encoding an extremely reduced FOV is the inevitable mismatch between the actual deformation field resulting from the undersampled data and the deformation field associated with the calibration data. While the minimum achievable ESP, as determined by slew rate and gradient strength, often gives larger distortions than the corresponding reduced FOV acquisition, provided a high enough FOV reduction factor is used, it has been previously shown that this mismatch only marginally affects the quality of the parallel imaging reconstruction. According to one embodiment of the invention, an alternative strategy to acquire calibration data with deformation matched to the actual data consists in acquiring the b=0 images using a multishot approach, with the k-space raster shifted by a single line on every new excitation, so as to fully sample k-space. Because no diffusion gradients are played out, there are no phase inconsistencies between the different segments, and as multiple acquisitions are commonly used in DWI to build SNR, there is no additional time penalty.

One of the main limitations of the specific embodiment described above is that in order to avoid saturation effects, the maximum number of slices per TR is limited to as many can fit between two consecutive excitation side lobes.

In another embodiment of the invention, this limitation is removed by tilting the plane of the excitation gradients to produce staggered side lobes. In yet another embodiment of the invention, by phase modulating the 180° refocusing pulse, multiple excitation lobes can be simultaneously refocused, imaged and resolved by means of a generalized parallel imaging approach, similar to the one described above. In more general terms, multiple narrow bands of magnetization arranged in a predefined geometrical pattern can be simultaneously excited and imaged. A generalized parallel imaging method with a POMP formulation can be used to resolve the resulting aliasing (in-plane and through-plane) while combining different bands of magnetization into a composite image with minimal artifacts at the boundary between adjacent bands. In one embodiment of the invention, multiple simultaneously excited bands are arranged in a grid pattern. In another embodiment they are arranged so as to maximize the performance of parallel imaging.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A magnetic resonance imaging method comprising:
   a) using a magnetic resonance imaging system to excite a field of view (FOV) for a target being imaged;
   b) using an excitation plan to limit said excited FOV to selected bands of magnetization;
   c) simultaneously exciting multiple said selected bands of magnetization within a single slice;
   d) applying phase encoding along a shortest FOV dimension;
   e) simultaneously acquiring a signal from each said excited selected band of magnetization; and
   f) combining different strips of said magnetization into a composite image to reconstruct and output a target image from said acquired signal.

2. The method according to claim 1 further comprises sweeping across a plurality of multiband excitation patterns in a phase-encoded direction, wherein said sweeping fills in coverage of gaps within a single said multiband pattern.

3. The method according to claim 2, wherein a corresponding signal is received only by a subset of coil elements that are proximal to said excited FOV band, wherein reconstruction of said image is performed using a generalized parallel imaging reconstruction method and a calibration method.

4. The method according to claim 1 further comprises limiting said FOV to reduce an echo train length (ETL), wherein a faster k-space traversal is obtained, wherein said faster k-space traversal is capable of reducing image distortion, wherein T2*-induced blurring is reduced.

5. The method according to claim 4 comprises using a 2D RF pulse to limit said FOV.

6. The method according to claim 5, wherein said 2D RF pulse has an echo-planar trajectory, wherein a fast echo-planar direction during said excitation corresponds to a phase-encode direction, wherein a slow echo-planar direction during said excitation is a slice-select direction during said imaging, wherein multiple said slices are simultaneously excited, wherein a fat tissue excitation profile is shifted in said slice-select direction with respect to a water signal.

7. The method according to claim 4 further comprises using an outer-volume suppression approach to limit said FOV, wherein a signal from outside a desired said FOV is suppressed using saturation pulses.

8. The method according to claim 6, wherein in-plane multiband excitation patterns are obtained by summing multiple said 2D RF pulses after a linear phase modulation of individual said 2D RF sub pulses sub-pulse.

9. The method according to claim 8, wherein a 2D echo-planar RF excitation pulse and an RF refocusing pulse are configured to ensure refocusing of a main lobe of a periodic 2D excitation in a slice-select direction while suppressing a fat tissue excitation signal for each planar simultaneously excited band.

10. The method according to claim 9, wherein said 2D RF and a multiband refocusing RF pulse are configured to simultaneously refocus said main lobe and additional side lobes in said slice-select direction.

11. The method according to claim 9 where said refocusing RF pulse is up to a 180° pulse.

12. The method according to claim 1 further comprises using parallel imaging to resolve said multiple bands.

13. The method according to claim 1 further comprises steps selected from the group consisting of sweeping a pattern to excite a space between said multiple bands, and using parallel imaging to resolve said multiple bands.

14. The method according to claim 13, wherein a phase encoded FOV is selected to alias said multiple bands directly onto each other.

15. The method according to claim 13 wherein a phase-encoded FOV is selected to alias said multiple bands imperfectly.

16. The method according to claim 13, wherein diffusion weighting is applied.

17. The method according to claim 1, wherein said excitation plan comprises exciting multiple arbitrary 2D volumes both in plane and through plane.

18. The method according to claim 17, wherein said excitation plan follows a grid pattern.

19. The method according to claim 17, wherein imaging comprises using parallel imaging.

20. The method according to claim 17, wherein said excitation plan follows an arbitrary pattern.

* * * * *